United States Patent [19]

Colegrove et al.

[11] Patent Number: 5,162,732
[45] Date of Patent: Nov. 10, 1992

[54] HE$^3$ SOLENOID MAGNETOMETER

[75] Inventors: Forrest D. Colegrove, Dallas; Bela I. Marton, Allen; Douglas D. McGregor, Plano, all of Tex.

[73] Assignee: Texas Instruments Incorporated, Dallas, Tex.

[21] Appl. No.: 829,603

[22] Filed: Jan. 29, 1992

Related U.S. Application Data

[63] Continuation of Ser. No. 569,875, Aug. 17, 1990, abandoned.

[51] Int. Cl.$^5$ .............................. G01R 33/26
[52] U.S. Cl. ................... 324/301; 324/304
[58] Field of Search ............ 324/300, 301, 302, 304, 324/318, 322

[56] References Cited

U.S. PATENT DOCUMENTS 4,390,494 6/1983 Salisbury .................... 324/319
5,036,278 7/1991 Slocum ....................... 324/304

Primary Examiner—Michael J. Tokar
Attorney, Agent, or Firm—Richard L. Donaldson; René E. Grossman

[57] ABSTRACT

A magnetometer having an enclosed cell containing He$^3$ therein for receiving light from a light source, a light source for directing light to the enclosed cell along a predetermined path, a single pick-up coil containing therein the light source and the enclosed cell, a solenoid containing the pick-up coil therein and a data collection system coupled to the pick-up coil. The light source is a source of circularly polarized light and can comprise a He$^4$ cell and an optical system and a circular polarizer disposed serially between He$^4$ cell and enclosed cell containing He$^3$. The predetermined path of the light source, the enclosed cell and the pick-up coil are disposed along the axis of the solenoid. The light source can also be a laser.

14 Claims, 2 Drawing Sheets

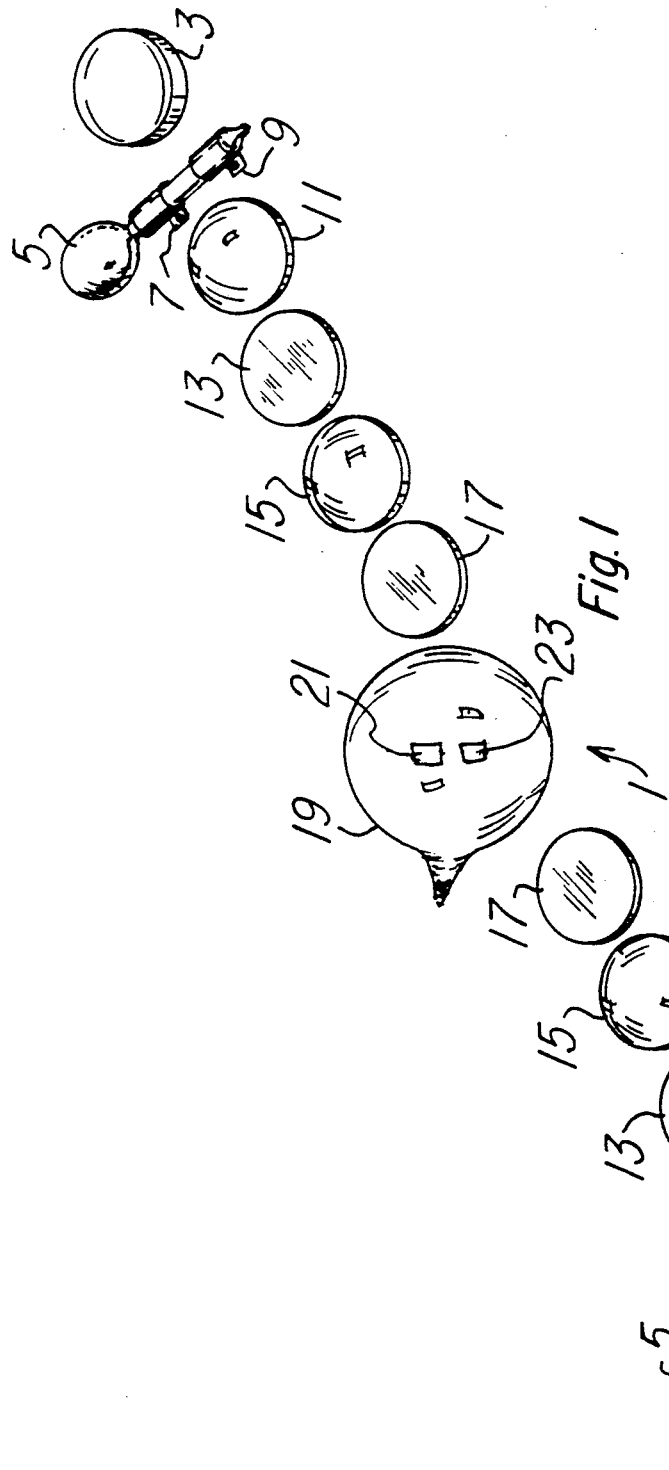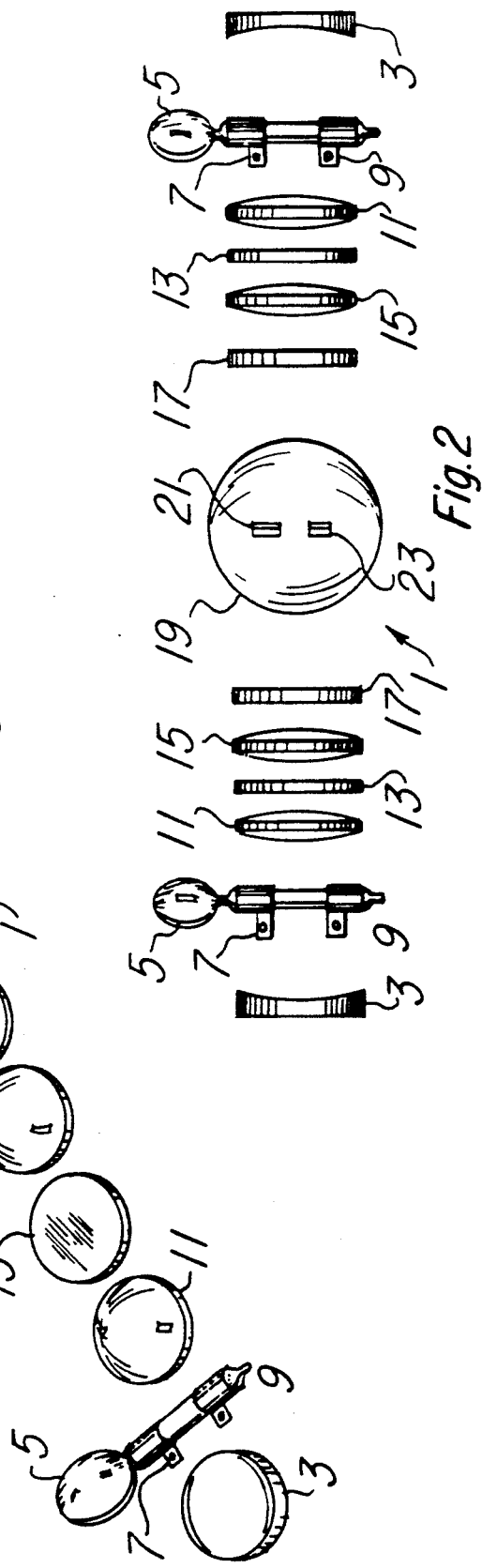

HE³ SOLENOID MAGNETOMETER

This application is a continuation of application Ser. No. 569,875, filed Aug. 17, 1990, and now abandoned.

BACKGROUND OF THE INVENTION

1. Field of the Invention

This invention relates to a magnetometer for use in detecting magnetic signals.

2. Brief Description of the Prior Art

High sensitivity He³ magnetometers are particularly useful in detecting quasistatic magnetic signals occurring over periods of many minutes, such as the signal produced by a slowly moving magnetic object passing a stationary magnetometer. In the use of such systems, the sensor, as configured in accordance with the prior art, must have a significant component of its axis, as defined by the light beam, aligned with the ambient (earth's) magnetic field during the brief preparation cycle in order for the sensor to operate properly. In fact, the signal size is maximum when aligned with the ambient magnetic field and is zero when at 90 degrees to the ambient magnetic field. He³ magnetometers of the above general type are described in Pat. No. 3,206,671 with improvements thereof in Pat. Nos. 4,567,439, 4,780,672, 4,814,707 and 4,697,519, the specifications thereof being incorporated herein by reference.

In the conventionally configured He³ magnetometer, polarization is produced in a cell by a beam of circularly polarized resonant radiation from a He⁴ or He³ lamp or a 10830 Angstrom laser directed along the ambient magnetic field direction for several minutes. The lamp and discharge in the cell are then turned off and the nuclear spins are caused to rotate to a plane perpendicular to the magnetic field. This rotation is accomplished by applying a varying voltage to a pair of Helmholtz coils as described in Pat. No. 4,567,439. The nuclear precession frequency is measured by the AC current induced in a pair of coils near the cell. Two coils are used because, in this geometry, the light beam must be directed perpendicular to the coil axes instead of aligned with the axes. Coupling of energy from precessing He³ moments into the coils is not as efficient as in the case of a single coil. When the signal decays, the process must be repeated. It is desirable to remove this orientation requirement and also to improve device sensitivity.

SUMMARY OF THE INVENTION

In accordance with the present invention, the above desired improvements are provided.

Briefly, in accordance with the present invention, the light source, preferably an He⁴ light source, optical polarizers and He³ cell are disposed within a single pick-up coil, all of the elements being aligned within and along the axis of an end corrected solenoid. An end corrected solenoid is a solenoid wherein extra turns are wound on each solenoid end to produce a more uniform field inside the solenoid. During the pumping cycle, a direct current is passed through the solenoid to produce a field somewhat larger than the ambient field to be measured. The direct current serves the sole purpose of producing a steady magnetic field inside the solenoid and must be large enough (depending upon the number of windings and other characteristics of the solenoid) so that the resulting vector sum of the solenoid field and the external field is directed substantially along the solenoid axis. After the pumping cycle, the weak discharge in the cell, the light source and the current in the solenoid are turned off. The spin rotation is then accomplished by the technique described in Pat. No. 4,567,439 using the solenoid instead of a Helmholtz pair which is no longer required. The pick-up coil with its axis colinear with the light beam is more efficiently coupled to the cell than in the prior art, resulting in a larger signal and therefore a more sensitive magnetometer. The voltage induced in the pickup coils by the precessing He³ nuclei has a frequency: $f = GH$, where $G$ is a constant and $H$ is the ambient magnetic field. The purpose of the device is to measure the magnitude of the magnetic field. It does so by measuring the precession frequency of the He³ nuclei which is directly related to the field by the equation $f = GH$.

Some of the novel features of the present system involve replacing the pair of sense coils of the prior art with a single pick-up coil closely coupled to the cell containing the polarized He³ nuclei, removing the spin flip Helmholtz pair, and placing the pick-up coil, He³ cell and light source inside an end-corrected solenoid. The solenoid provides a magnetic field during the pumping cycle and is also used to flip the spins of the He³ nuclei 90 degrees with respect to the direction of the ambient or earth's magnetic field. A principal feature of this arrangement is that the pumping can be accomplished with the sensor in any arbitrary orientation with respect to the ambient magnetic field. There will still be a requirement that, after the pumping cycle ends, the spins of the nuclei must be precessing in a plane perpendicular to the earth's magnetic field and the pick-up coil axis must not be aligned with the ambient magnetic field.

BRIEF DESCRIPTION OF THE DRAWINGS

FIG. 1 is an exploded view of a portion of an He³ magnetometer in accordance with the present invention;

FIG. 2 is a schematic diagram of the elements of FIG. 1 in assembled state;

DESCRIPTION OF THE PREFERRED EMBODIMENT

Figure 3:
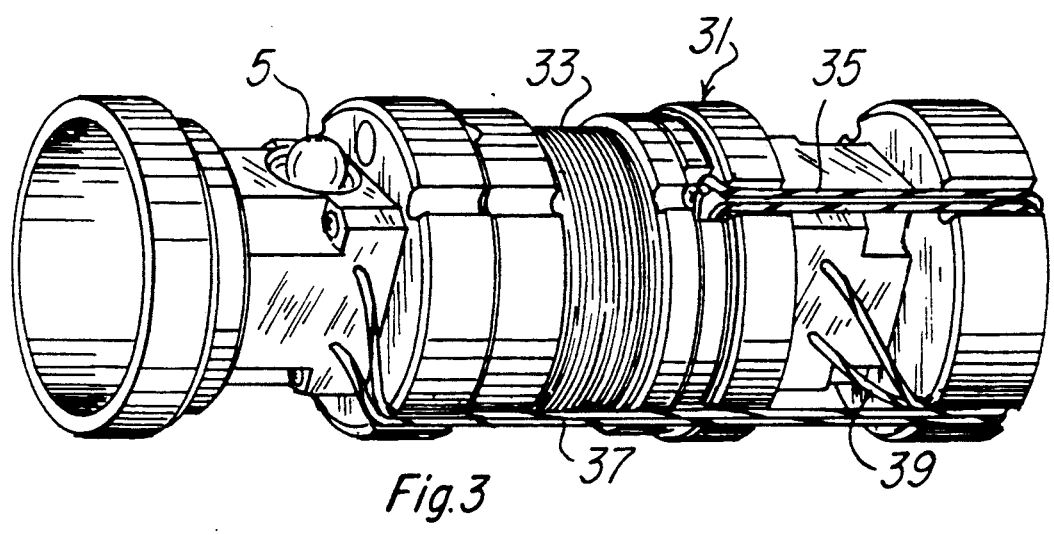
FIG. 3 is an elevational view of a housing and coil containing the magnetometer portion of FIGS. 1 and 2 therein.

Referring first to FIG. 1, there is shown an exploded view of a portion of the magnetometer sensor 1 in accordance with the present invention. The magnetometer sensor portion 1 includes on each side of the sphere 19, a mirror 3, an He⁴ lamp 5 having a pair of electrodes 7 and 9 thereon to which is connected a source of high frequency RF discharge (e.g. 25 MHz) which glows brightly when excited by the RF transmitter and a lens system for focussing or collimating light from the lamp 5 onto the sphere 19, the lens system including a first lens 11 and a second lens 15 spaced from the first lens 11 by a spacer 13. The system further includes a linear polarizer 17 with a quarter wave plate thereon whereby the linear polarizer receives unpolarized light from the light source with an electric field in all directions perpendicular to the direction of propagation and passes only light with an electric field in one direction, the quarter wave plate placing the electric field in two out-of-phase directions to provide a rotation (i.e, an electric vector rotating in a plane perpendicular to the direction of propagation, which is circularly polarized light), which light passes into the hollow sphere filled with $He^3$. There is nothing critical about either the frequency or voltage of the RF energy, it merely being required that a discharge be created in the lamp. A typical frequency used for this purpose is 25 KHz. which ignites the discharge in the lamp and maintains the electrical discharge in the $He^3$ cell during the pumping cycle. The sphere 19 includes a pair of electrodes 21 and 23 on the surface thereof connected to a source of high frequency RF energy (e.g. 25 KHz.) to excite a weak electrical discharge within the cell.

It should be understood that the mirror 3, lamp 5 and lens system 11, 13 and 15 can be replaced by a laser which emits light at the absorption wavelength of $He^3$ metastable atoms (approximately 1083 nanometers).

Referring now to FIG. 2, there is shown the elements described with respect to FIG. 1 as those elements would be arranged in an actual embodiment. It can be seen that the elements on opposite sides of the sphere 19 are identical and arranged in a mirror image of each other.

Referring now to FIG. 3, there is shown a magnetic-free housing 31, preferably formed of a phenolic resin with the structure of FIGS. 1 and 2 (not shown) secured therein. The housing 31 includes a pick-up coil 33 thereon with a first set of wires (not shown) extending from the coil to a data collection system (not shown) of standard type as is well known in the art. Also shown are wires 37 which are connected to the electrodes 7 and 9 of the lamp 5 on one side of the sphere 19 and wires 39 which are connected to electrodes 7 and 9 of the lamp 5 on the other side of the sphere 19. The wires 35 are connected to the electrodes 21 and 23 on the sphere 19.

Figure 4:
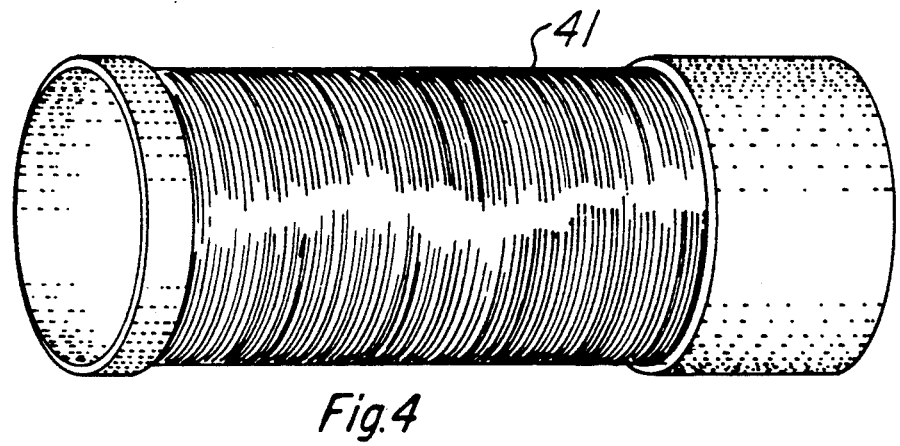
FIG. 4 is an elevational view of a solenoid containing the housing and coil of FIG. 3 therein.

The housing 31 of FIG. 3 with the magnetometer structure of FIGS. 1 and 2 disposed therein is secured within a solenoid 41 as shown in FIG. 4 wherein only the solenoid is shown. The solenoid 41 includes wires thereto (not shown) for applying a signal thereto.

In operation, a high frequency, (e.g. 50 MHz.), RF voltage sufficient to produce an electrodeless electrical discharge is applied to the lamp electrodes 7 and 9 of lamp 5. A direct current is passed through the solenoid 41 to produce an axial magnetic field along the solenoid axis which is approximately twice the earth's magnetic field or larger. This provides good alignment of the magnetic field with the optical axis for more efficient pumping and improved polarization. The helium nuclei in the sphere 19 are excited to the $2^3S_1$ metastable level by application of a high frequency voltage (e.g. 25 KHz.) across the electrodes 21 and 23 of cell 19. The light from the lamps 5 is passed both directly and by reflection from the mirror 3 through the lens system 11, 13, 15 and the circular polarizer 17 through the sphere 19 to provide circularly polarized light within the sphere. This circularly polarized light causes atomic transitions in the $He^3$ disposed within the sphere 19 from the $2^3S_1$ metastable levels to higher atomic levels from which they automatically return to the metastable level causing an alignment or polarization of the $He^3$ atoms along the magnetic field by a well known optical pumping process. The scientific theory is well known and will not be discussed herein.

The system is allowed to remain in this state for about 3 to 4 minutes. The lamps 5 and the discharge in the cell 19 are then turned off and the field produced by the solenoid is then turned off slowly (about 0.1 second or longer) to allow the moments to gradually move and align with the then existent magnetic filed. At this time, an external RF field is applied across the sphere 19 by applying a signal in the form of a frequency ramp as described in Pat. No. 4,567,439 to the terminals 35 of the solenoid 41 for the spin flip since the nuclei are now lined up with the earth's magnetic field. This causes the polarization to be shifted by ninety degrees with respect to the direction of the earth's magnetic field. This is accomplished in all cases except when the axis of the solenoid 41 is lined up with the earth's magnetic field. Since the nuclei are precessing and act in the manner of a bar magnet, the magnetic signals therefrom are picked up by the pick-up coil 33 (not shown in FIG. 1) which surrounds the structure of FIG. 1. The signal from the pick-up coil 33 is then sent back to a data collection system (not shown) for evaluation or other use.

The frequency of the signal from pick-up coil 33 is a direct and precise measure of the magnetic field surrounding the sensor. If a magnetic object, such as, for example, a submarine, moves within the detection range of the sensor (or conversely if the sensor is moved when near the magnetic object), the magnitude of the magnetic field changes, causing the frequency detected in coil 33 to change. The changes in frequency are recorded by an external device and the passage of the submarine or other object is detected.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A magnetometor sensor comprising, in combination:
   (a) an enclosed cell containing $He^3$ therein for receiving light from a light source;
   (b) a light source capable of emitting light at the absorption wavelength of $He^3$ atoms directing such light to said cell along a predetermined path;
   (c) a single pick-up coil containing therein said light source and said enclosed cell magnetically coupled to said enclosed cell; and
   (d) a solenoid providing a magnetic field along the axis thereof and containing said cell therein.

2. A sensor as set forth in claim 1 wherein said light source is a source of circularly polarized light.

3. A sensor as set forth in claim 2 wherein said source of circularly polarized light comprises a $He^4$ cell and an optical system and a circular polarizer disposed serially between said $He^4$ cell and said enclosed cell containing $He^3$.

4. A sensor as set forth in claim 1 wherein said predetermined path of said light source, said enclosed cell and said pick-up coil are disposed along the axis of said solenoid.

5. A sensor as set forth in claim 2 wherein said predetermined path of said light source, said enclosed cell and said pick-up coil are disposed along the axis of said solenoid.

6. A sensor as set forth in claim 3 wherein said predetermined path of said light source, said enclosed cell and said pick-up coil are disposed along the axis of said solenoid.

7. A sensor as set forth in claim 1 wherein said light source is a laser.

8. A magnetometer comprising, in combination:
(a) an enclosed cell containing $He^3$ therein for receiving light from a light source;
(b) a light source capable of emitting light at the absorption wavelength of $He^3$ atoms directing such light to said cell along a predetermined path;
(c) a single pick-up coil containing therein said light source and said enclosed cell magnetically coupled to said enclosed cell;
(d) a solenoid providing a magnetic field along the axis thereof and containing said cell therein; and
(e) data collection means coupled to said pick-up coil.

9. A method of measuring a magnetic field comprising the steps of:
(a) providing a solenoid having an axis and disposed in an ambient magnetic field;
(b) producing a magnetic field along said axis of said solenoid of predetermined magnitude slightly in excess of said ambient magnetic field;
(c) providing an enclosed cell containing $He^3$ therein and disposed within said solenoid and in said produced magnetic field;
(d) exciting said $He^3$ to the $2^3S_1$ metastable state;
(e) causing said $He^3$ excited to the $2^3S_1$ metastable state to transfer to a higher atomic level for a predetermined time;
(f) causing said magnetic field to shift; and
(g) providing a coil apart from said solenoid magnetically coupled to said cell to sense said shift in said magnetic field.

10. The method of claim 9 wherein step (d) is provided by emitting light at the absorption wavelength of $He^3$ atoms and directing such light to said cell along a predetermined path.

11. The method of claim 9 wherein the step (e) is provided by applying a high frequency voltage across the interior of said cell.

12. The method of claim 10 wherein step (e) is provided by applying a high frequency voltage across the interior of said cell.

13. The method of claim 12 further including the step of removing said high frequency voltage and said light prior to step (f) for a predetermined time.

14. The method of claim 10 further including the step of removing said light prior to step (f).

* * * * *